United States Patent
Raghavan et al.

(10) Patent No.: US 8,258,041 B2
(45) Date of Patent: Sep. 4, 2012

(54) METHOD OF FABRICATING METAL-BEARING INTEGRATED CIRCUIT STRUCTURES HAVING LOW DEFECT DENSITY

(75) Inventors: Srinivas Raghavan, Allen, TX (US); Kalyan Cherukuri, Allen, TX (US); Thomas E. Lillibridge, Richardson, TX (US); Richard A. Faust, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/816,381

(22) Filed: Jun. 15, 2010

(65) Prior Publication Data

US 2011/0306207 A1    Dec. 15, 2011

(51) Int. Cl.
*H01L 21/20* (2006.01)
(52) U.S. Cl. .......................... 438/396; 438/240; 438/669
(58) Field of Classification Search .................. 438/396, 438/240, 669
See application file for complete search history.

(56) References Cited

U.S. PATENT DOCUMENTS

| | | | |
|---|---|---|---|
| 4,443,295 | A | 4/1984 | Radigan et al. |
| 6,686,237 | B1 | 2/2004 | Wofford et al. |
| 6,806,196 | B2 * | 10/2004 | Wofford et al. ............... 438/704 |
| 7,573,086 | B2 | 8/2009 | Huber et al. |
| 2003/0231458 | A1 | 12/2003 | Hong et al. |
| 2007/0045774 | A1 * | 3/2007 | Huber et al. .................. 257/532 |
| 2007/0048962 | A1 * | 3/2007 | Hendy et al. .................. 438/396 |

* cited by examiner

*Primary Examiner* — Jarrett Stark
*Assistant Examiner* — John M Parker
(74) *Attorney, Agent, or Firm* — Jacqueline J. Garner; Wade J. Brady, III; Frederick J. Telecky, Jr.

(57) ABSTRACT

A method of fabricating metal-bearing structures in an integrated circuit such as metal-polysilicon capacitors using conductive metal compounds. Defects due to organometallic polymers formed during the etch of a hard mask material are minimized by using a process that includes a plasma etch for the hard mask that achieves a predominantly chemical character using a fluorine-based etch chemistry. Using a low-temperature liquid-phase strip of the hard mask photoresist instead of an ash prevents further cross-linking of polymers formed during the plasma etch. Etching the metal-bearing material using a hot fully-concentrated mixture of ammonium hydroxide and hydrogen peroxide allows short etch times that are particularly shortened for tantalum nitride films deposited with a nitrogen concentration of about 30 percent or greater.

21 Claims, 6 Drawing Sheets

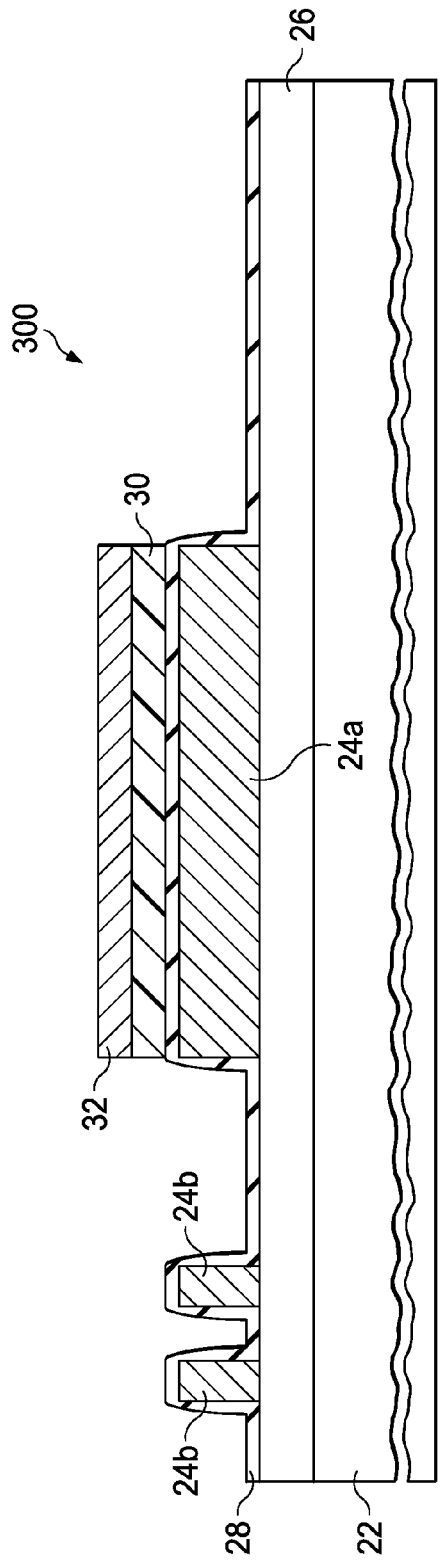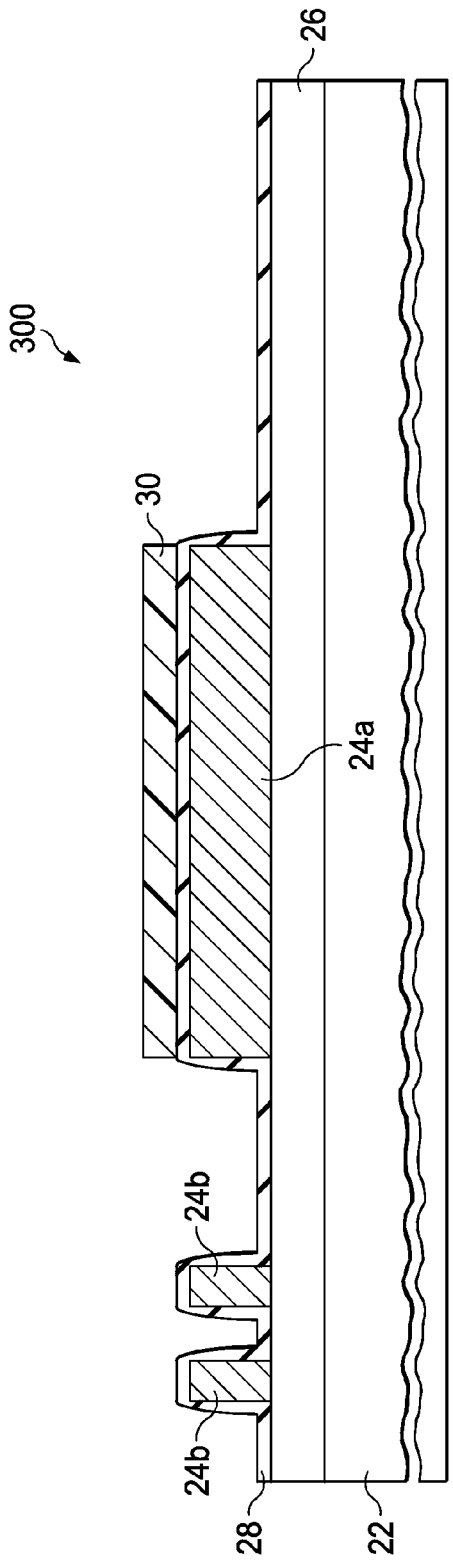

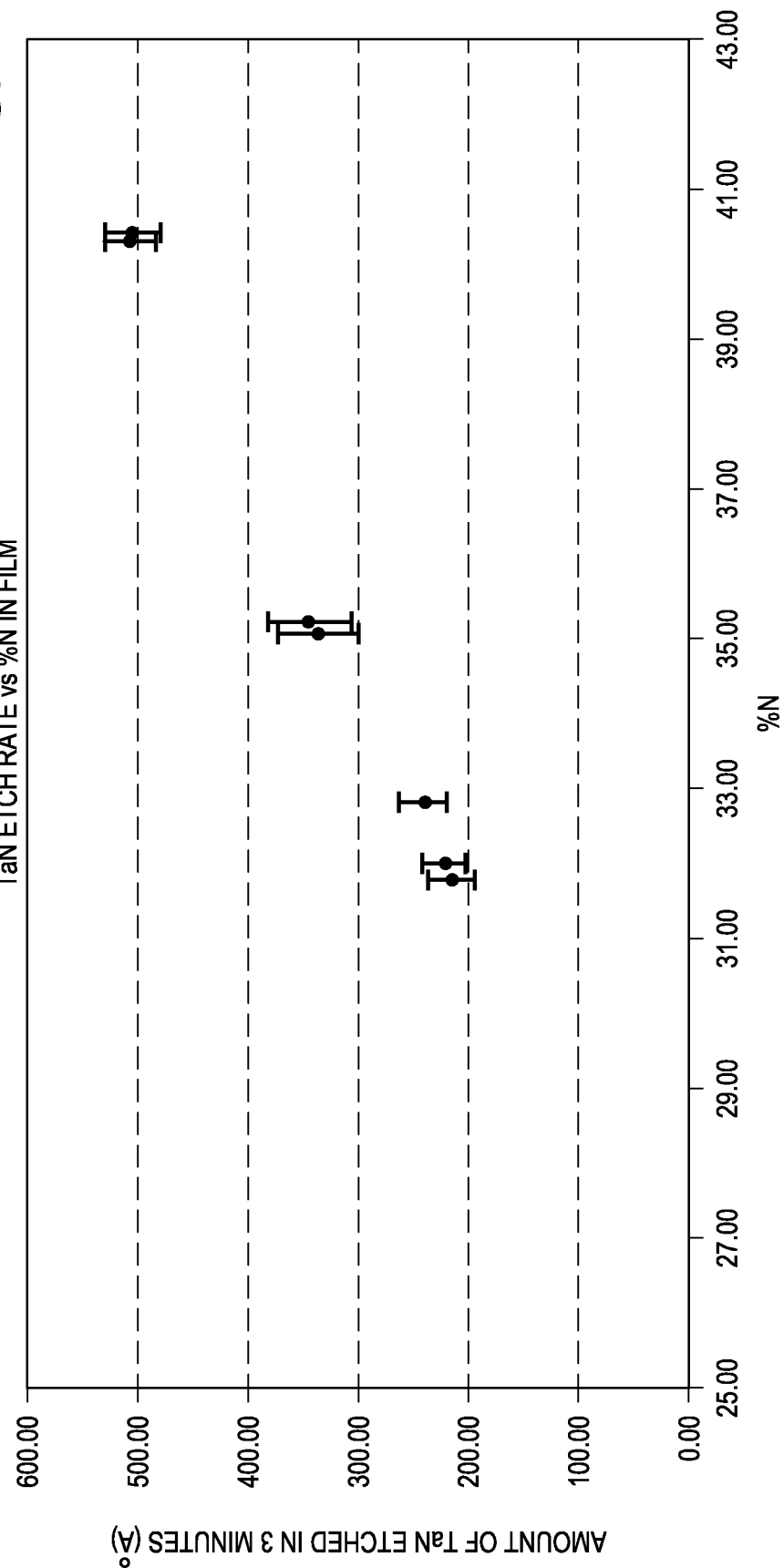

METHOD OF FABRICATING METAL-BEARING INTEGRATED CIRCUIT STRUCTURES HAVING LOW DEFECT DENSITY

CROSS-REFERENCE TO RELATED APPLICATIONS

This Application is related to the subject matter described in U.S. patent application Ser. No. 12/549,538 by Raghavan, et al., filed Aug. 28, 2009, and entitled LOW TEMPERATURE SURFACE PREPARATION FOR REMOVAL OF ORGANOMETALLIC POLYMERS IN THE MANUFACTURE OF INTEGRATED CIRCUITS. That application describes a method of removing photoresist from a surface during the manufacture of an integrated circuit, which is a step in a preferred embodiment described below. Accordingly, the entire contents of U.S. patent application Ser. No. 12/549,538 are hereby incorporated by reference.

BACKGROUND OF THE INVENTION

1. Field of the Invention

This invention is in the field of integrated circuit manufacture. Embodiments of this invention are more specifically directed to methods of forming metal-bearing structures having low defect density due to organometallic polymer and other residues.

2. Description of the Related Art

In recent years, the variety of materials used in the formation of integrated circuits has broadened, so as to take advantage of the properties of certain materials in the continued improvement of device performance and the continued reduction in "chip" area required for realization of a circuit function. The presence of a number of different materials tends to complicate the manufacturing process involved in formation of the integrated circuit, particularly from the standpoint of residues and contaminants generated by various materials. A particular source of such residues comes from the chemical removal, in whole or in part, using "dry" etches (e.g., plasma-assisted processes) or "wet" (liquid-phase) etches of the various layers involved in manufacturing the integrated circuit. The difficulty of removing such residues is increasing, as physical feature sizes are reduced, and as metal-bearing materials such as refractory metals and their compounds are introduced for new functions including making integrated passive components such as capacitors and resistors as well as interconnects.

By way of example to illustrate some of the types of residues that can form during a conventional integrated circuit manufacturing process, FIG. 1 shows a schematic cross-section of an integrated circuit parallel-plate capacitor 100 at a stage during its manufacture according to a conventional process. Referring to FIG. 1, isolation dielectric 6 may be disposed at a surface of substrate 2, which is a semiconductor body at a surface of a wafer at which an integrated circuit is to be formed. As known in the art, isolation dielectric 6 at the surface of substrate 2 serves to electrically isolate various doped regions (e.g., wells, heavily-doped regions such as source and drain regions, and collector and base regions) that are formed at the surface of substrate 2 and serve as part of the circuit being formed. These doped regions are thus present within substrate 2, but are not shown in the cross-sectional views of FIG. 1, either for the sake of clarity, or because such regions are located elsewhere in the device away from the section illustrated in FIG. 1. Polycrystalline silicon (polysilicon) elements 4a, 4b, are formed and patterned at the surface of isolation dielectric 6. In this example, polysilicon element 4a will constitute a lower plate of a planar capacitor, and polysilicon elements 4b constitute conductors in the integrated circuit, connecting various devices. At locations of the integrated circuit other than that shown in FIG. 1, polysilicon elements 4b that overlie a thin gate dielectric layer rather than isolation dielectric 6 may constitute gate electrodes of metal-oxide-semiconductor (MOS) transistors.

Capacitor dielectric 8 is formed of an insulative material, such as silicon nitride or silicon oxide, in a layer over polysilicon elements 4 and isolation dielectric 6, and conductor layer 10 is formed over capacitor dielectric 8. Conductor layer 10 in this example is formed of a metal-bearing material such as a metal, metal alloy, or metal compound, for example aluminum, copper, copper-doped aluminum, tungsten, tantalum, titanium, or conductive compounds of metals such as nitrides or silicides of metals, such as tantalum nitride (TaN). In this example, at the stage of manufacture illustrated in FIG. 1, conductor layer 10 has been photolithographically patterned and etched to define a top plate of the planar capacitor having polysilicon element 4a as its lower plate, with a film of capacitor dielectric 8 between these two plates. As such, a hard mask layer (not shown), for example formed of silicon nitride, was formed over conductor layer 10, and photoresist (not shown) applied over the hard mask layer. In the state of manufacture illustrated in FIG. 1, photoresist has been patterned (selectively exposed and developed) to no longer protect portions of the hard mask layer, the hard mask layer has been etched, using, for example a plasma etch ("dry etch") to result in a patterned hard mask layer, and the patterned photoresist used for the hard mask etch has been removed. The removal of photoresist may be done in a conventional manufacturing process after the hard mask etch using, e.g., a plasma ash process. Finally, the conductor layer 10 that was unprotected by the hard mask has been etched, for example, by using a wet etch process, and the remaining hard mask layer has been removed.

As known in the art, residues 15x may form as a result of these conventional process steps in several ways. Residues can remain at the surface of the structure after one or more steps, and may be in the form of a contiguous film, or as lines or particles or spots of contaminant material. As one example, during the hard mask etch, due to imperfect selectivity of the hard mask plasma etch, some of the conductor layer 10 is consumed and some of the removed conductor material reacts with the polymer of the photoresist during the hard mask etch process to form organometallic polymers having a composition that includes metallic components of the conductor layer. Such organometallic polymers may be resistant to plasma ashing processes used for photoresist removal, and may even harden further due to cross-linking at elevated temperature, such as during the plasma ash. Residues 15x that are caused by organometallic polymer remain at the surface of the structure over capacitor conductor layer 10. These residues 15x can include an organometallic polymer material itself, and may also include material (e.g., material from hard mask or from capacitor dielectric 8) that was undesirably protected from subsequent etches by residue. As shown in FIG. 1, residues 15x can also gather in the space between closely-spaced polysilicon elements 4b.

As a second example of residue formation in a conventional process, etching of conductor layer 10 can result in redeposition of the conductive metal-bearing material from conductor layer 10, which is particularly difficult to remove from high aspect ratio spaces such as in the space between closely-spaced polysilicon elements 4b. Removal of these metallic conductive defects, sometimes called "stringers,"

can be addressed using a longer etch step for the conductor layer 10, which can result in undesirable lateral and vertical dimensional changes to this layer. Remaining metallic defects can also undesirably mask later etch steps. Thus residues 15x can cause electrical failure in the eventual integrated circuit that is fabricated from the structure shown in FIG. 1, for example by causing electrical leakage between polysilicon elements 4b, or by causing an open or resistive contact if a contact or via etched through subsequently-deposited insulator films is at the location of a remaining residue 15x. In any case, the presence of residues 15x at the surface of elements within the fabricated integrated circuit is undesirable, and can cause increased defect density and resultant yield loss.

Conventional ways of removing residues 15x include performing additional etch steps and a variety of liquid-phase cleaning processes. The required etch and clean process times are often long in an attempt to completely remove residues created by previous process steps. Cleaning processes designed to remove one type of residue can make other types of residue more resistant to removal. These additional etch and cleaning process steps are non-value added, because they do not contribute directly to the formation of the desired circuit structures, and instead add time and cost to the fabrication of the integrated circuits. Sometimes specialized equipment is required to perform cleaning or removal processes. Additional cleaning and removal process steps also increase the defect density on the final devices, not only because there are now additional opportunities to introduce contamination, but also because the vigorous etching and cleaning that must be performed to guarantee removal of unwanted residues also further etches and changes the dimensions and shapes of the desired structures. There thus remains a need for improved methods of fabricating metal-bearing structures in which the formation of organometallic and other residues is minimized or eliminated, in which the residues that are formed tend to be of a composition that is readily removed, and that use process steps for residue removal that cause minimal damage to existing device structures.

SUMMARY OF THE INVENTION

These and other problems associated with the prior art are addressed by the present invention, which provides a method of fabricating metal-bearing integrated circuit structures having low defect density by reducing the formation of organometallic polymers and stringer defects. This method is particularly suited to forming a metal-polysilicon capacitor in an integrated circuit in which the top capacitor plate is formed using a layer of tantalum nitride (TaN). No unusual materials, equipment, or reagents are required, and these methods allow for a reduction both in the number of process steps and in process time for some of the steps. Defects due to organometallic polymers formed during an etch of a hard mask material are minimized by using a process that includes a dry plasma etch for the hard mask that achieves a predominantly chemical character using a fluorine-based etch chemistry. Using a low-temperature liquid-phase strip of the hard mask photoresist instead of a plasma ash prevents further cross-linking of polymers formed during the plasma etch. Etching the metal-bearing material using a hot fully-concentrated mixture of ammonium hydroxide and hydrogen peroxide allows short etch times. Etch times are particularly shortened for tantalum nitride films that are deposited having a nitrogen concentration of about 30 percent or greater.

More specifically, the present invention provides a method for fabricating metal-bearing structures in an integrated circuit. In this method, a conductor layer of a metal-bearing material is formed near a surface of a semiconducting body. A hard mask layer is then deposited over the conductor layer, and photoresist is dispensed over the hard mask layer. The photoresist is patterned to expose selected portions of the hard mask layer. A predominantly chemical plasma etch is used to etch the exposed portions of the hard mask layer in order to expose portions of the conductor layer that are to be removed. Finally, the exposed portions of the conductor layer are removed using a fully-concentrated mixture of ammonium hydroxide and hydrogen peroxide.

The present invention also provides a method for forming a metal-polysilicon capacitor in an integrated circuit. A patterned polysilicon layer on a substrate is provided.

A dielectric layer is deposited over the polysilicon layer, and then a layer of tantalum nitride is formed over the dielectric layer. A hard mask layer is deposited, and photoresist is applied over the hard mask layer and photolithographically patterned. The hard mask layer is then etched. In one embodiment, remaining photoresist is removed using a low-temperature wet process using sulfuric acid and hydrogen peroxide, which also removes organometallic polymer and monomer residues. This wet photoresist strip avoids the high temperatures involved in conventional plasma ash processes, thereby avoiding significant cross-linking of the organometallic polymers or monomers that can make them difficult to remove. Finally, the tantalum nitride layer is etched using a fully-concentrated mixture of ammonium hydroxide and hydrogen peroxide.

Other features and advantages of the present invention will be apparent to those of ordinary skill in the art upon reference to the following detailed description taken in conjunction with the accompanying drawings, and the appended claims.

BRIEF DESCRIPTION OF THE VIEWS OF THE DRAWINGS

For a more complete understanding of the present invention, and the advantages thereof, reference is now made to the following description taken in conjunction with the accompanying drawings, in which:

FIGS. 3A, 3B, 3C, 3D, 3E, and 3F are cross-sectional views of various stages of manufacture of an integrated circuit, according to embodiments of this invention; and FIG. 4 is a plot showing the etch rate of a TaN film as a function of nitrogen concentration in the film using a fully-concentrated wet etch of ammonium hydroxide and hydrogen peroxide.

DETAILED DESCRIPTION

This invention will be described in connection with one or more of its embodiments, namely as implemented into a manufacturing process for fabricating a particular integrated circuit having elements formed of metal or metal compounds. However, it is contemplated that this invention may also be beneficial when applied to other processes and in connection with other applications. In particular, while an example of this invention is described in detail in connection with the fabrication of a parallel-plate capacitor in an integrated circuit, this invention is no more particularly directed to the forming of a capacitor than it is to the forming of any other integrated circuit element or structure. Accordingly, it is to be understood that the following description is provided by way of example only, and is not intended to limit the true scope of this invention as claimed.

Figure 2:
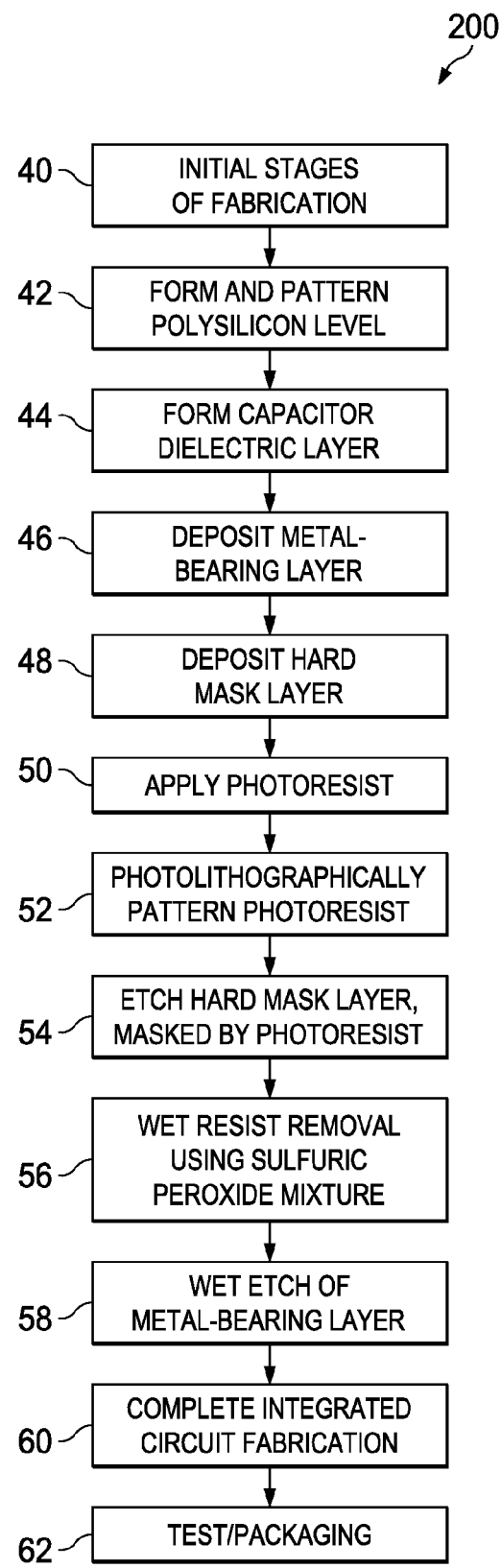
FIG. 2 is a flow chart of a method for forming a metal-polysilicon capacitor in an integrated circuit according to an embodiment of the present invention.

Referring now to FIG. 2, which depicts a flow chart for a process 200 for fabricating metal-bearing structures in an integrated circuit according to an embodiment of the invention, a method particularly suited to fabricating a metal-polysilicon integrated circuit capacitor will next be described. As part of initial step 40, a substrate is provided. It is to be appreciated that the terms substrate or semiconductor substrate as used herein can include a base semiconductor wafer or any portion thereof (e.g., one or more wafer dice) as well as any epitaxial layers or other type of semiconductor layers formed thereover and associated therewith. The substrate can comprise, for example, silicon, SiGe, GaAs, InP, and/or silicon-on-insulator (SOI). In addition, the substrate can already include various device elements formed therein such as transistors, for example, and/or layers thereon. These can include metal layers, barrier layers, dielectric layers, device structures, diffused regions, and/or isolation structures. The fabrication of integrated circuits according to this embodiment of the invention begins with process 40, in which various initial stages of fabrication are performed to partially fabricate underlying elements in the integrated circuit in a manner that are not particularly important in connection with this embodiment of the invention, but which instead are determined by the construction of the desired integrated circuit. As such, process 40 includes such process steps as preparation and cleanup of the starting material including semiconducting portions of a surface of a wafer, formation of epitaxial layers, formation of isolation structures (e.g., formation of an isolation dielectric such as a PMD or pre-metal dielectric nitride layer), formation of doped regions such as wells and moat regions at locations defined by the isolation structures, formation and photolithography of various interconnections, contacts, vias, and the like. It is contemplated that those skilled in the art will readily comprehend the extent of this process 40 for particular integrated circuits.

As a next step in forming a metal-polysilicon capacitor, in this embodiment of the invention, polysilicon elements are formed in process 42, in the conventional manner. As known in the art, polycrystalline silicon is typically deposited by way of chemical vapor deposition, and doped either n-type or p-type, either in situ during its deposition or subsequently to its deposition. Conventional photolithography and etch of this polysilicon layer is also included within process 42. In a preferred embodiment, in order to reduce the resistivity of the polysilicon layer for use as the bottom plate of a capacitor, a silicide layer may be formed on the surface of the polysilicon layer using cobalt, titanium, tungsten, nickel, or other suitable metal. In this case, such a capacitor may be referred to as a metal-silicide capacitor.

Because a parallel-plate capacitor is being formed in this example of an embodiment of this invention, process 44 then forms a capacitor dielectric layer overlying polysilicon elements; the particular manner in which process 44 is carried out depends on the material of capacitor dielectric and on other factors conventional in the art. According to this embodiment of the invention, process 46 then deposits a conductor layer in the form of a layer of a metal-bearing material. The conductor layer is metal-bearing in the sense that it is formed of a material that includes one or more metals, either in an elemental form as a single metal or an alloy or mixture of metals, or in the form of a metal compound. Examples of material suitable for use as a conductor layer include aluminum, copper, tungsten, titanium, tantalum, alloys or mixtures of these metals such as TiW, and metal compounds such as nitrides and silicides of those metals. Tantalum nitride (TaN) is a useful example of such a metal compound appropriate for use in connection with this example of an embodiment of the invention. Any one of a number of conventional methods of deposition are suitable for use in connection with process 46, depending of course on the material of the conductor layer and the desired thickness and other material properties; examples of these methods include evaporation, sputtering or physical vapor deposition, direct reaction, and chemical vapor deposition. Choice and control of the composition of the conductor layer are important to the following steps, as will be discussed later in more detail in connection with FIG. 3A. For example, in the case of TaN, deposition under conditions which produce a higher nitrogen percentage in the film is found to enable a faster wet etch later in the process.

Still referring to FIG. 2, steps 48 through 58 are connected with the patterning and etching of the metal-bearing conductor layer. A hard mask is used in the patterning and etching of the conductor layer into its desired pattern corresponding to the layout of the integrated circuit being formed. As known in the art, a hard mask consists of a dielectric layer or other hard material that is itself patterned and etched into the desired pattern corresponding to that of the underlying material that is eventually to be etched (e.g., in this case, the conductor layer). The use of a hard mask is especially useful in those cases in which the underlying material is generally slow to etch; the hard mask ensures that sufficient masking material remains to protect the portion of the underlying material that is to remain in the integrated circuit being formed. In this example, tantalum nitride is a material for which use of a hard mask is beneficial. As such, in process 48, a layer of hard mask material is deposited over conductor layer to the desired thickness required for the thickness of conductor layer and the etch conditions to be encountered. The specific material of hard mask layer depends on the material selected for conductor layer and the plasma etch chemistry. For the example of tantalum nitride (TaN) as conductor layer, silicon nitride is a suitable material for hard mask layer.

The hard mask layer is itself patterned according to the desired layout of the conductor layer. As such, in process 50, a photoresist layer is applied to the desired thickness over the hard mask layer, in the conventional manner (e.g., spinning-on). Then in process 52, the photoresist is photolithographically patterned and developed in the conventional manner, so that photoresist remains at the surface of the structure at those locations at which the conductor layer is to remain. After this patterning of the photoresist, the hard mask layer is etched in process 54, masked by photoresist in order to protect the selected locations of hard mask layer.

Figure 1:
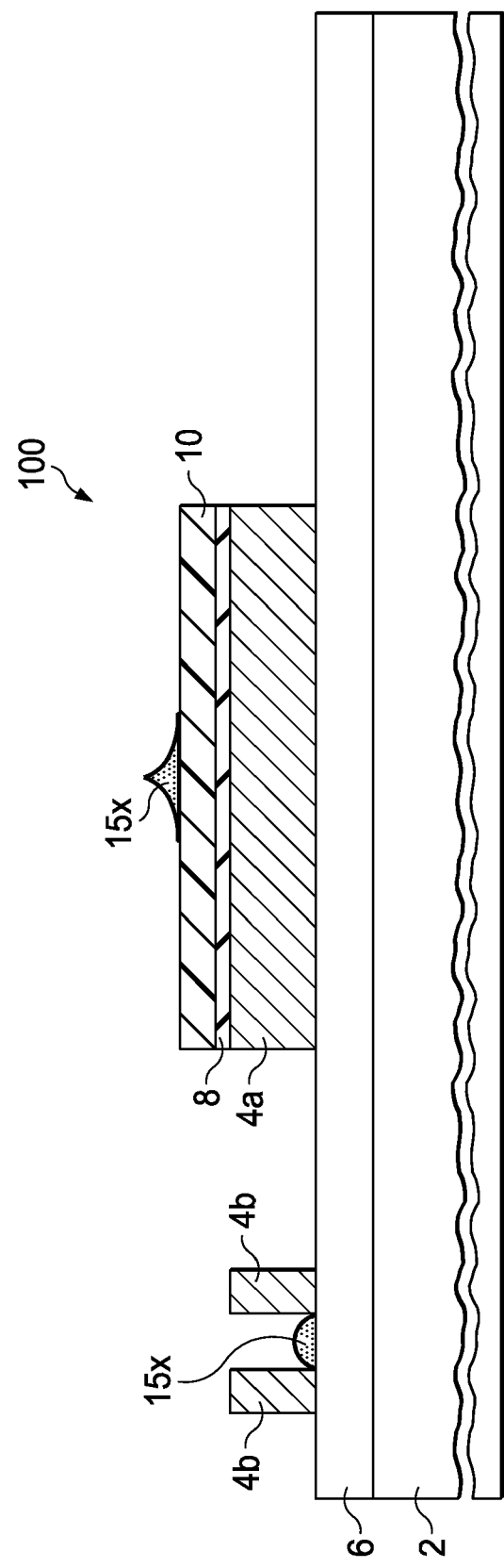
FIG. 1 is a cross-sectional and schematic view of an integrated circuit at a stage of manufacture according to a conventional manufacturing process, illustrating recognition of the source of a problem according to this invention.

In one embodiment, the etch process 54 is a plasma etch with parameters chosen to minimize organometallic polymer formation as well as sputter redeposition of the materials in the conductor layer. Specifically, the plasma etch is designed to use a process gas that minimizes polymer formation, and with parameter settings and gases chosen to promote predominantly chemical mechanisms and minimize physical etch mechanisms. Suitable process gases and parameters depend on the conductor layer and the hard mask materials. For the case of TaN, high dissociation rate fluorine-based etch chemistries produce the highest possible volatility of etch by-products, thereby minimizing generation of organometallic residue. Using conventional chlorine-based etches on TaN results in tantalum chloride species that are not very volatile, and thus a process gas which contains fluorine and no chlorine is preferred. Fluorocarbons such as $CF_4$, $C_4F_8$, $C_5F_8$, $CHF_3$, $C_2HF_5$, etc., could be used as process gases, but may result in more polymer formation than sulfur hexafluoride ($SF_6$) or nitrogen trifluoride ($NF_3$). Thus $SF_6$ or $NF_3$ is used in a preferred embodiment. Finally, power settings and process gases are chosen to minimize physical sputtering in the etch and result in a predominantly chemical plasma etch. For this reason, in a preferred embodiment, a process gas that contains helium and no argon is used in a predominantly-chemical plasma etch, and in general lighter rather than heavier molecules are preferred in the process gas. The use of a predominantly chemical plasma etch is beneficial in preventing the formation of stringer defects, which as discussed in relation to FIG. 1 are particularly difficult to remove with later process steps after their formation due to their location within narrow and high aspect ratio geometries. Using a predominantly chemical plasma etch for step 54 also minimizes the formation of organometallic polymer residues elsewhere.

Referring back to FIG. 2, according to this embodiment of the invention, wet resist removal process 56 is next performed to remove the remaining portions of photoresist. In this embodiment of the invention, wet resist removal process 56 preferably uses a sulfuric peroxide mixture as the reagent for this process. As known in the art, wet processing is typically performed by immersing the wafer in a bath of liquid-phase reagent, and may include agitation of that bath; this wet processing may also be performed by dispensing liquid-phase reagent to the surface of a wafer cushioned by a gas, as in single-wafer machines. An example of this sulfuric peroxide mixture observed to be useful in connection with process 56 according to this embodiment of the invention is about a 1:10 volumetric ratio of sulfuric acid to hydrogen peroxide. In wet resist removal process 56, the temperature of the sulfuric peroxide mixture should be below about 70 degrees Celsius, to prevent undesired cross-linking of organometallic polymer and monomer molecules. Not only does wet resist removal process 56 in this manner remove the remaining portions of photoresist, this process 56 also removes the organometallic polymer and monomer molecules present at the surface at this stage of the process.

After the photoresist and residue have thus been removed, the metal-bearing conductor layer is preferably etched at step 58 using a wet etch. In this example, TaN is etched in the conventional manner, but using a fully-concentrated mixture of ammonium hydroxide and hydrogen peroxide. The ratio of ammonium hydroxide to hydrogen peroxide in the mixture is preferably greater than 1:3, making the mixture highly basic. The term fully-concentrated is used herein to mean the use in the mixture of full standard concentrations of the reagents, undiluted by the addition of any water to the mixture above the proportion of water that exists in the standard concentrations of the reagents. Standard concentrations of liquid semiconductor reagents are determined by storage stability and government regulations for safe transport. For example, for the case of hydrogen peroxide, a standard concentration is nominally 30 percent, corresponding to an acceptable assay of 29 to 32 percent by weight of hydrogen peroxide in water; and for ammonium hydroxide, standard concentrations are nominal 29 percent, corresponding to an acceptable assay of 28 to 30 percent, or alternatively nominal 27 or 28 percent depending on the manufacturer. Performing this etch at a raised temperature of greater than about 70 degrees Celsius and with this high concentration and highly basic composition enables the etch of the metal-bearing layer to take place quickly, several times faster than conventional wet etches. With TaN layer thicknesses in the 500 to 800 angstrom range, etch times from one to 15 minutes have been achieved, compared to 45 minutes for conventional etches performed at lower temperatures of around 50 degrees Celsius.

Following the processing that results in the definition of conductors in the metal-bearing conductor layer, process 60 is then performed to complete the fabrication of the integrated circuit, in wafer form. In general, process 60 will involve additional insulating layers and conductive layers that are formed by conventional deposition and etch processes, including the etching of contacts through such insulating layers to make physical and electrical contact to doped regions in substrate and to structures formed by polysilicon elements and the conductor layer, among others. Following the fabrication of all levels of metallization specified by the design of the overall integrated circuit, wafer fabrication process 60 will generally be completed by the application of a protective overcoat, through which openings to metal bond pads or other connective lands are made. Following wafer fabrication process 60, the desired electrical testing of the integrated circuits in wafer form, and such "back-end" processes as dicing of the individual circuits from the wafer, electrical test, packaging, burn-in, and additional electrical testing, are then typically performed (process 62 of FIG. 2) to result in a packaged integrated circuit that may then be implemented into end equipment. It is to be understood that such additional wafer fabrication processes 60 and test and packaging processes 62 shall not constitute a material change in the structure described herein.

In one embodiment of the present invention, the remaining portions of the hard mask layer are removed as part of step 60 before completing additional steps in the integrated circuit fabrication. This step might then enable, for example, using the same principles and repeating steps 44 through 58 at least once in order to fabricate a second metal-bearing conductor layer, or more than once to produce additional metal-bearing layers, with insulating or dielectric layers separating the metal-bearing layers, to manufacture multilayer structures with low defect density. For example, instead of a metal-polysilicon capacitor, a metal-insulator-metal capacitor could be formed, between a first metal-bearing conductor layer and a second metal-bearing conductor layer that are separated by a capacitor dielectric layer formed over the first metal-bearing conductor layer. Similar methods can be used to fabricate multilayer capacitors or interconnects. Alternatively, if only a single layer of capacitors is to be produced, step 60 might include a step of depositing an insulative capping layer over the metal-bearing conductor layer after the hard mask layer has been removed. For the case of TaN as the conductor layer, a suitable capping layer could be another layer of silicon nitride (e.g., PMD nitride).

Additional details will now be provided with reference to FIGS. 3A through 3F, which depict cross-sections of a metal-polysilicon capacitor within an integrated circuit 300 at different stages during its manufacture according to the methods of the present invention. These cross-sections have been chosen to correspond schematically to the status of a parallel-plate capacitor and neighboring integrated circuit structures at particular steps in the process 200 depicted in FIG. 2.

Figure 3A:
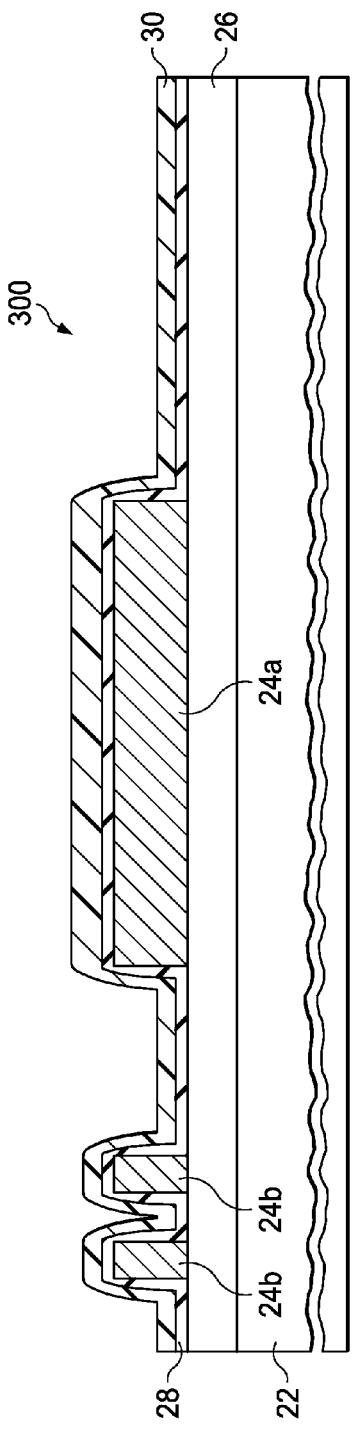

FIG. 3A shows a schematic cross-section of a metal-polysilicon capacitor and some surrounding features as it would appear after step 46 in process 200, in which a metal-bearing conductor layer 30 has just been deposited. Earlier steps in the process of fabricating an integrated circuit have left layers and structures that are evident in this cross-section. Isolation dielectric 26 is disposed at a surface of substrate 22, and may be formed of any conventional insulating material useful for its purpose (e.g., silicon dioxide, silicon nitride, etc.). Conventional methods for forming isolation dielectric 26 include its deposition onto the surface of substrate 22 or into trenches formed into substrate 22, and thermal oxidation of selected locations of the surface substrate 22. As mentioned earlier, a preferred isolation dielectric for use with a TaN capacitor is silicon nitride, also called PMD nitride. Polycrystalline silicon (polysilicon) elements 24a, 24b, are formed at selected locations of the surface of the structure; at the location shown in FIGS. 3A through 3F, these polysilicon elements 24a and 24b are insulated from substrate 22 by isolation dielectric 26. In this example, polysilicon element 24a will constitute a lower plate of a planar parallel-plate capacitor to be formed. Because polysilicon elements 24b in this example overlie isolation dielectric 26, these polysilicon elements 24b operate as polysilicon-level conductors or interconnections. As known in the art, polysilicon elements 24b may also constitute gate electrodes of metal-oxide-semiconductor (MOS) transistors at those locations (not shown) at which they overlie a thin gate dielectric. And as discussed earlier, a silicidation step (a step of forming a silicide such as cobalt silicide on the polysilicon layer) may optionally be performed to enhance the conductivity of the polysilicon before depositing a capacitor dielectric layer.

In this example in which a parallel-plate capacitor is being formed, and at this stage of manufacture, a layer of capacitor dielectric 28, formed of an insulative material such as silicon nitride or silicon oxide, is disposed in a layer over polysilicon elements 24 and isolation dielectric 26. Conductor layer 30 is disposed over capacitor dielectric 28. According to embodiments of this invention, conductor layer 30 in this example is formed of a metal, metal alloy, or metal compound (or a mixture thereof); examples of the material of conductor layer 30 include aluminum, copper, copper-doped aluminum, tungsten, tantalum, and conductive compounds of metals such as nitrides or silicides of metals. As such, conductor layer 30 will be referred to, for purposes of this description and in a general sense, as being formed of a metal-bearing material. In a particular example of embodiments of this invention, conductor layer 30 is formed of tantalum nitride (TaN). And in the example shown in FIGS. 3A through 3F, the top plate of the parallel-plate capacitor will be formed from this conductor layer 30, with the dimensions and location of that plate defined by photolithography.

The specific conditions used in the deposition of metal-bearing material in step 46 can affect the ultimate precision and defect density of metal-bearing structures fabricated according to this invention. As an example, with respect to the PVD deposition (physical vapor deposition or reactive sputtering) of TaN as the metal-bearing material, it has been observed that the concentration of nitrogen in the deposited film can significantly affect the rate at which the film etches during step 58 in process 200. Evidence for this is shown in FIG. 4, which is a plot of TaN etch rate versus %N in the film. More specifically, the amount of thickness reduction of uniform films of TaN that were etched for a fixed time of 3 minutes is plotted as a function of a nitrogen concentration derived from 4-point probe resistivity measurements of each film. It can be appreciated that etch rates are high for the range of nitrogen concentration depicted, from about 30% to about 42%, and extrapolation of these data to lower concentrations confirms another experimental observation that prior-art nitrogen concentrations in the as-deposited films of approximately 23% require much longer etch times. It is to be understood in relation to this discussion of composition that the shorthand formula "TaN" for tantalum nitride does not imply a particular composition or stoichiometry, since as written it would imply a nitrogen atomic concentration of 50%. As is known in the art, TaN films deposited by PVD in fact are composed of a mixture of a number of micro- and nano-structured phases and stoichiometries of tantalum nitride, of which the tantalum-rich phases have lower resistivity. As low resistivity is desirable in the function of a capacitor or interconnects, a tradeoff may ultimately occur in increasing nitrogen concentration between achieving a high wet etch rate and resulting in an unacceptably high resistivity in the TaN film. It has been shown that nitrogen concentrations above 30% result in well-performing capacitors having low defect densities according to an embodiment of the present invention.

Figure 3B:
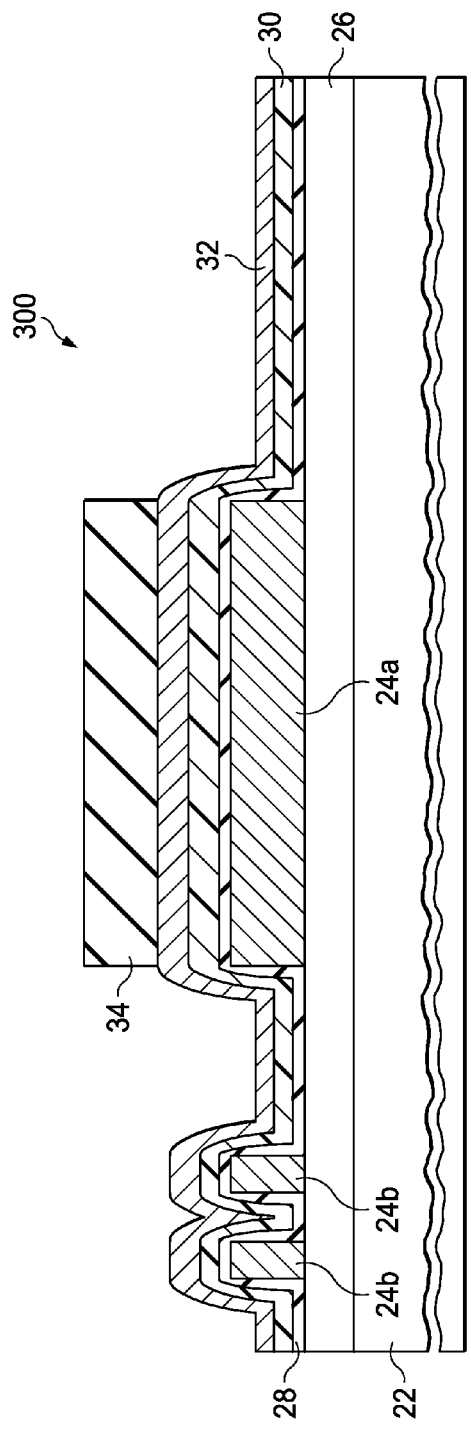

Referring now to FIG. 3B, which is a cross-section as it would appear after step 52 in process 200, hard mask layer 32 in this example has been formed of silicon nitride, deposited by way of e.g. chemical vapor deposition over conductor layer 30. Hard mask layer 32 will mask selected portions of conductor layer 30 from etch, defining those portions of that layer that are to remain in the integrated circuit being fabricated. Hard mask layer 32 will be itself patterned and etched away from other locations of the surface of the structure, with patterned photoresist 34 serving as its mask material. In the state of manufacture illustrated in FIG. 3B, photoresist 34 has been previously dispensed over the surface of the structure, and has been selectively exposed and developed to be removed from those locations of the surface of hard mask layer 32 corresponding to locations at which conductor layer 30 is to be etched away.

Figure 3C:
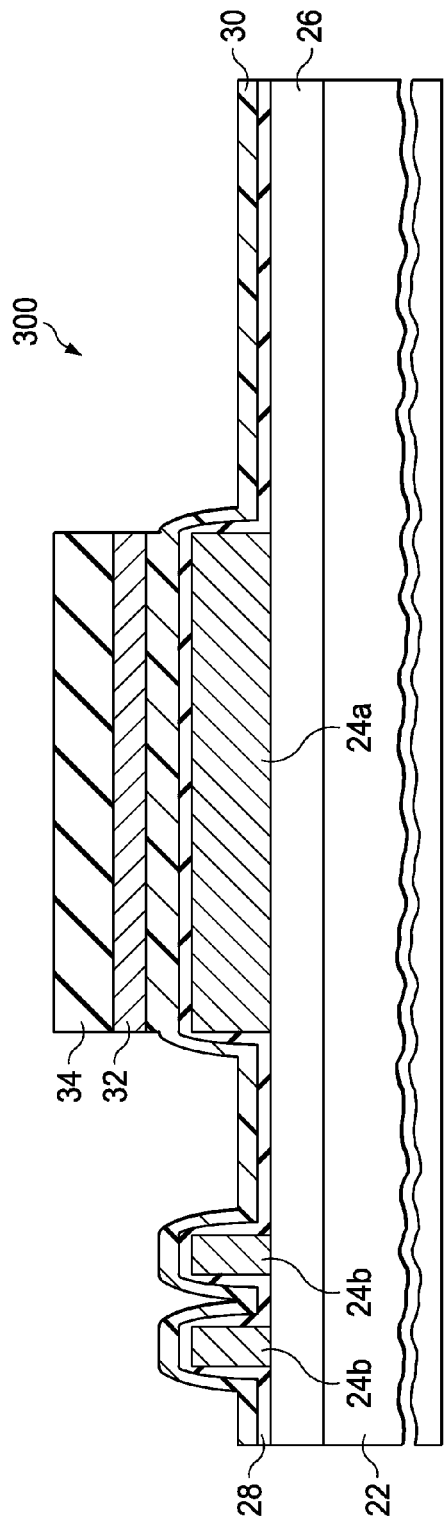

Now at the point in the manufacture illustrated in FIG. 3C, corresponding to the appearance after step 54 in process 200, hard mask layer 32 has been etched to remove portions of that layer that are not protected by the patterned photoresist 34. The particular manner in which the hard mask etch is carried out depends on the material of hard mask layer 32 and of conductor layer 30, as it is desired that this etch will somewhat selectively etch hard mask layer 32 relative to conductor layer 30. For this example in which hard mask layer 32 is formed of silicon nitride and conductor layer 30 is formed of tantalum nitride, the etch of hard mask layer 32 is a predominantly-chemical plasma etch ("dry etch") involving a fluorinated etchant (preferably $SF_6$ or $NF_3$) for etching silicon nitride. Using the etch conditions previously discussed in the description of step 54 result in the removal of mask layer 32 from those locations of the surface of the structure other than those locations underlying photoresist 34, and photoresist 34 itself is also eroded to some extent by this etch. Portions of conductor layer 30 at locations that are exposed after the removal of hard mask layer 32 are also consumed, to some extent, by the hard mask etch, but as previously discussed, the chosen etch chemistries and process gases (no chlorine, helium instead of argon), and other etch conditions promote a predominantly chemical etch minimizes the production of difficult-to-remove organometallic polymer residues, as well as resputtered metal-bearing material, which in this example embodiment is TaN.

Figure 3D:
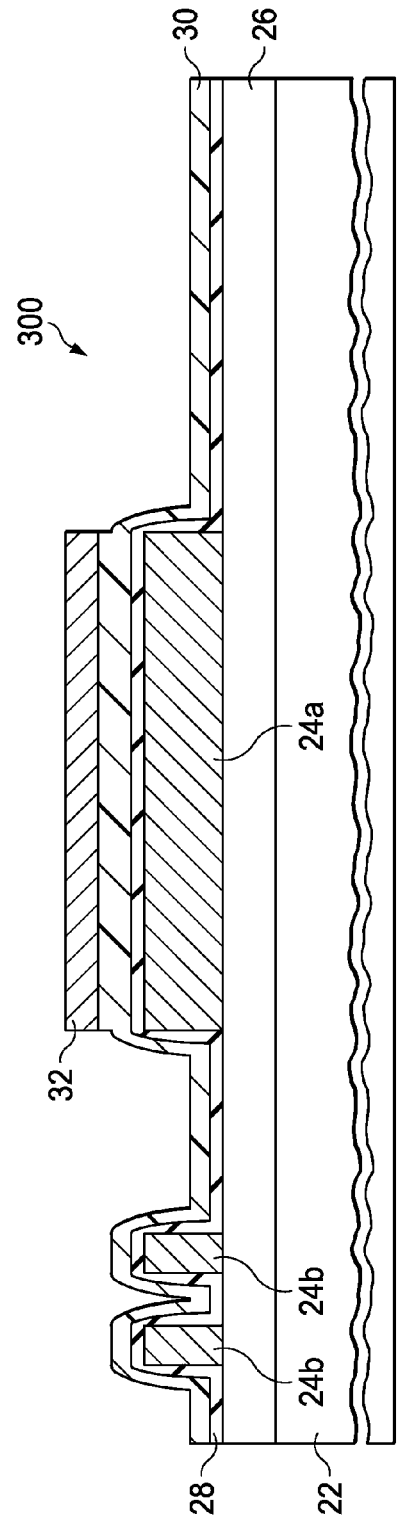

FIG. 3D shows the integrated circuit capacitor after process step 56 of removing photoresist 34, preferably using a wet process using a sulfuric peroxide mixture as described earlier in the discussion of FIG. 2 and step 56. This leaves a patterned layer of hard mask 32 overlying conductor layer 30 in areas where it is desired that conductor layer 30 remain, which in this example specifically means directly over polysilicon lower capacitor plate 24a to form a top capacitor plate.

FIG. 3E illustrates the result of step 58 in process 200, in which a wet etch of the metal-bearing layer 30 has been performed using a fully-concentrated mixture of ammonium hydroxide and hydrogen peroxide. Preferred etch mixture composition and temperature conditions have been previously described in conjunction with the discussion of step 58.

The result is that portions of conductor layer 30 that are not protected by hard mask layer 32 have been removed quickly and without residue, even over high aspect ratio polysilicon structures 24b.

Finally, in one embodiment of the present invention, the remaining portions of the hard mask layer 32 are removed as part of step 60 before completing additional steps in the integrated circuit fabrication. After this part of step 60, the cross-section would appear as illustrated in FIG. 3F. It can be appreciated that at this point in the process 200, a number of alternative paths toward finishing fabrication of an integrated circuit are possible, as have already been discussed, including repeating the foregoing sequence of process steps to form more layers of dielectric 28 and conductor 30, depositing a capping layer, or continuing with other process steps in the integrated circuit. In any case, it will be appreciated that following the teachings of the present invention, the completed structures shown in FIG. 3F are free of organometallic polymer residues and stringer defects that could deleteriously affect integrated circuit yield and performance.

A number of advantages provided by the present invention will be readily apparent to those skilled in the art. According to embodiments of this invention, significant improvement in the defect density and thus improvement in the overall yield of manufactured integrated circuits result, since organometallic polymers that are typically extremely difficult to remove, once formed, are removed at a point in the manufacturing process while still in a form (short chain polymers or monomers) that enables such removal, and prior to being exposed to conditions that cause significant cross-linking No unusual materials, equipment, or reagents are required, and thus these methods are highly compatible with modern integrated circuit fabrication process flows. More importantly, these methods also allow for a significant reduction both in the number of process steps and in process time for some of the steps. As one example, applying a plasma etch process using a predominantly chemical etch using fluorine-based chemistries according to the present invention for silicon nitride over tantalum nitride results in lower generation of organometallic residues, and cross-linking (hardening or polymerization) of such residues are avoided by using a low-temperature acidic wet strip to remove the photoresist. This wet strip replaces two steps in the prior art comprising a plasma ash requiring a special cold chuck modification to the equipment and a long wet clean. The plasma etch and wet strip also eliminate the need for another cleaning step before the wet etch of the TaN conductor layer. As a second example, the deposition of TaN with a high nitrogen concentration and using a high-temperature, fully-concentrated ammonium hydroxide and hydrogen peroxide mixture according to the present invention enables a much shorter wet etch. Etch times are reduced from 45 minutes in the prior art to 6 minutes or less, and even down to less than one minute in some cases, thereby resulting in not only shorter process times, but also reduced dimensional losses.

The present invention has been described in connection with forming a parallel-plate capacitor within an integrated circuit. It will be appreciated that such a capacitor is representative of only one suitable environment for use of the invention, and that the invention may be used in a multiple of other environments in the alternative. As evident from this description, conductor layer 30 need not be used to form a plate of a capacitor or any other specific circuit structure. Indeed, it is contemplated that conductor layer 30 will also serve as an interconnection layer within the integrated circuit being fabricated, at locations away from that shown in FIGS. 3A through 3F. The parallel-plate capacitor in this description is presented merely by way of example. Other geometries for capacitors having higher aspect ratio geometries stand to benefit even more from this invention, such as interdigitated, serpentine, fractal, or other types of capacitors having narrow lines and spaces. And other semiconductor devices such as resistors may similarly be advantageously fabricated according to the teachings presented herein. The principles taught herein may be also applied sequentially to form multiple layers of metal-bearing material separated by insulating layers. And in general, the fabrication of other metal-bearing materials than TaN, for example, tantalum or tungsten metals, should also benefit from the process provided by this invention in producing structures having low defect density and well-controlled dimensions.

Although preferred embodiments provided by the present invention have been described in detail, and several alternative forms of the invention have been shown, it will be apparent to those skilled in the art that the principles taught herein may be implemented in other contexts, in many other ways and by using processes and methods differing in a number of details. It will therefore be understood by those skilled in the art that various modifications can be made therein without departing from the spirit and scope of the invention as set forth in the appended claims.

We claim:

1. A method for fabricating metal-bearing structures in an integrated circuit, the method comprising the steps of:
    forming a first conductor layer of a metal-bearing material near a surface of a semiconducting body;
    depositing a first hard mask layer over the first conductor layer;
    dispensing photoresist over the first hard mask layer;
    patterning selected portions of the photoresist to expose portions of the first hard mask layer;
    etching the exposed portions of the first hard mask layer using a predominantly chemical plasma etch whereby portions of the first conductor layer are exposed, wherein the plasma etch uses a process gas that contains fluorine and no chlorine; and
    removing the exposed portions of the first conductor layer using a fully-concentrated mixture of ammonium hydroxide and hydrogen peroxide to form a first patterned conductor layer.

2. The method of claim 1, wherein the metal-bearing material comprises a material selected from the group consisting of metals, metal alloys, and conductive metal compounds.

3. The method of claim 1, wherein the metal-bearing material comprises a material selected from the group consisting of tantalum nitride, tantalum, and tungsten.

4. The method of claim 1, wherein the metal-bearing material comprises tantalum nitride having a nitrogen concentration of greater than about 30 percent.

5. The method of claim 1, wherein the process gas comprises a compound selected from the group consisting of sulfur hexafluoride and nitrogen trifluoride.

6. The method of claim 1, wherein the plasma etch uses a process gas that contains helium and no argon.

7. The method of claim 1, wherein the step of removing is performed at a temperature of greater than about 70 degrees Celsius.

8. The method of claim 1, wherein the ratio of ammonium hydroxide to hydrogen peroxide in the mixture is greater than about 1:3.

9. The method of claim 1, further comprising the step of stripping the photoresist after etching the first hard mask layer.

10. The method of claim 9, wherein the step of stripping comprises applying a mixture of sulfuric acid and hydrogen peroxide to the surface to remove the photoresist.

11. The method of claim 1, further comprising the step of removing the first hard mask layer after removing the exposed portions of the first conductor layer.

12. A method for fabricating metal-bearing structures in an integrated circuit, the method comprising the steps of:

forming a first conductor layer of a metal-bearing material near a surface of a semiconducting body;

depositing a first hard mask layer over the first conductor layer;

dispensing photoresist over the first hard mask layer;

patterning selected portions of the photoresist to expose portions of the first hard mask layer;

etching the exposed portions of the first hard mask layer using a predominantly chemical plasma etch whereby portions of the first conductor layer are exposed; and removing the exposed portions of the first conductor layer using a fully-concentrated mixture of ammonium hydroxide and hydrogen peroxide to form a first patterned conductor layer;

removing remaining portions of the photoresist and the first hard mask layer;

depositing an insulating layer over the first patterned conductor layer;

forming a second conductor layer of a metal-bearing material over the insulating layer;

depositing a second hard mask layer;

dispensing photoresist over the second hard mask layer;

patterning selected portions of the photoresist to expose portions of the second hard mask layer;

etching the exposed portions of the second hard mask layer using a predominantly chemical plasma etch whereby portions of the second conductor layer are exposed; and removing the exposed portions of the second conductor layer using a fully-concentrated mixture of ammonium hydroxide and hydrogen peroxide to form a second patterned conductor layer, whereby a structure comprising two patterned conductor layers separated by the insulating layer is produced.

13. A method of forming a metal-polysilicon capacitor in an integrated circuit, the method comprising the steps of:

providing a patterned polysilicon layer near a surface of a substrate;

depositing a dielectric layer over the polysilicon layer;

forming a layer of tantalum nitride over the dielectric layer;

depositing a hard mask layer;

applying photoresist over the hard mask layer;

photolithographically patterning the photoresist;

etching the hard mask layer, using a predominantly chemical plasma etch that contains fluorine and no chlorine; and etching the tantalum nitride using a fully-concentrated mixture of ammonium hydroxide and hydrogen peroxide.

14. The method of claim 13, wherein the dielectric layer comprises silicon nitride.

15. The method of claim 13, wherein the tantalum nitride layer is formed under conditions such that the nitrogen concentration in the tantalum nitride layer is greater than about 30 percent.

16. The method of claim 13, wherein the hard mask layer comprises silicon nitride.

17. The method of claim 13, further comprising performing the step of forming a silicide on the polysilicon before the step of depositing the dielectric layer.

18. The method of claim 17, wherein the silicide comprises cobalt silicide.

19. The method of claim 13, further comprising the step of stripping the photoresist using a mixture of sulfuric acid and hydrogen peroxide at a temperature of less than about 70 degrees Celsius.

20. The method of claim 13, wherein the ratio of ammonium hydroxide to hydrogen peroxide in the mixture used in the step of etching the tantalum nitride is greater than about 1:3.

21. The method of claim 13, wherein the step of etching the tantalum nitride is performed at a temperature of greater than about 70 degrees Celsius.

* * * * *